(12) United States Patent
von Rueckmann et al.

(10) Patent No.: US 7,894,876 B2
(45) Date of Patent: Feb. 22, 2011

(54) COMBINED MR-OPTICAL COIL FOR PROSTATE, CERVIX AND RECTUM CANCER IMAGING DIAGNOSTICS

(75) Inventors: Bogdan von Rueckmann, München (DE); Ralph Gareus, Forchheim (DE); Ralph Weissleder, Peabody, MA (US); Arne Hengerer, Erlangen (DE); Wilhelm Dürr, Erlangen (DE)

(73) Assignee: Siemens Medical Solutions, Inc., Malvern, PA (US)

( * ) Notice: Subject to any disclaimer, the term of this patent is extended or adjusted under 35 U.S.C. 154(b) by 1161 days.

(21) Appl. No.: 11/048,312

(22) Filed: Feb. 1, 2005

(65) Prior Publication Data

US 2008/0132777 A1    Jun. 5, 2008

(51) Int. Cl.
   *A61B 5/05*     (2006.01)
(52) U.S. Cl. .................. 600/423; 600/411; 600/476
(58) Field of Classification Search ........... 600/410, 600/411, 422, 423, 433, 466, 476
   See application file for complete search history.

(56) References Cited

U.S. PATENT DOCUMENTS

| | | | | |
|---|---|---|---|---|
| 3,779,234 A | * | 12/1973 | Eggleton et al. | ............ 600/466 |
| 4,633,882 A | | 1/1987 | Matsuo et al. | |
| 5,273,041 A | * | 12/1993 | Richards et al. | ............. 600/411 |
| 5,330,490 A | * | 7/1994 | Wilk et al. | .................. 606/153 |
| 5,427,103 A | * | 6/1995 | Fujio et al. | .................. 600/423 |

(Continued)

FOREIGN PATENT DOCUMENTS

DE    101 42 394 A1    11/2002

OTHER PUBLICATIONS

Konings et al. "Development of an MR-safe tracking catheter with a Laser-driven tip Coil." Journal of Magentic Resonance Imaging, JMRI (United States). Jan. 2001, 13(1), p. 131-5.*

(Continued)

*Primary Examiner*—Eric F Winakur
*Assistant Examiner*—Vani Gupta
(74) *Attorney, Agent, or Firm*—Donald B. Paschburg; F. Chau & Associates, LLC

(57) ABSTRACT

We present, in exemplary embodiments of the present invention, a system combining anatomical imaging technologies (e.g., MR) with optical technologies. The system can be used for a variety of applications, including, but not limited to, (1) cancer diagnosis and staging; (2) image guidance; and (3) radiation therapy planning. Image guidance may include guiding a biopsy. For example, a prostatectomy potentially has severe side effects, such as impotence and incontinence. Thus, a histologically-confirmed diagnosis, such as one provided from a biopsy, may prevent unnecessary prostatectomy. Image guidance may also include guiding minimal invasive therapy, such as brachytherapy focused ultrasound. The present invention may be used to plan radiation therapy, for example, by detecting, and thus sparing, healthy tissue from radiation exposure.

25 Claims, 1 Drawing Sheet

U.S. PATENT DOCUMENTS

| | | | |
|---|---|---|---|
| 5,728,092 A * | 3/1998 | Doiron et al. | 606/15 |
| 5,879,284 A * | 3/1999 | Tsujita | 600/109 |
| 5,923,036 A * | 7/1999 | Tague et al. | 250/339.07 |
| 6,039,694 A * | 3/2000 | Larson et al. | 600/459 |
| 6,134,465 A * | 10/2000 | Frederick et al. | 600/410 |
| 6,146,415 A * | 11/2000 | Fitz | 623/1.11 |
| 6,171,240 B1 * | 1/2001 | Young et al. | 600/410 |
| 6,470,204 B1 * | 10/2002 | Uzgiris et al. | 600/411 |
| 6,832,108 B2 * | 12/2004 | deSouza et al. | 600/423 |
| 6,898,454 B2 * | 5/2005 | Atalar et al. | 600/410 |
| 6,925,322 B2 * | 8/2005 | Helfer et al. | 600/423 |
| 7,349,741 B2 * | 3/2008 | Maltan et al. | 607/57 |
| 7,389,137 B2 * | 6/2008 | Helfer et al. | 600/423 |
| 2002/0183622 A1 * | 12/2002 | Zuluaga et al. | 600/476 |

OTHER PUBLICATIONS

Blomqvist L et al: "Rectal tumours—MR imaging with endorectal and/or phased—array coils, and histopathological staging on giant sections. A comparative study." ACTA Radiologica (Stockholm, Sweden 1987) May 1997, vol. 38, No. 3, May 1997, pp. 437-444, XP008045218 ISSN: 0284-1851 p. 438, section I. Endorectal coil combined with pelvic phased array coil.

* cited by examiner

COMBINED MR-OPTICAL COIL FOR PROSTATE, CERVIX AND RECTUM CANCER IMAGING DIAGNOSTICS

CROSS-REFERENCE TO RELATED APPLICATIONS

This aplication claims priority to U.S. Provisional application No. 60/541,102, which was filed on Feb. 2, 2004, and which is fully incorporated herein by reference.

This application is related to U.S. patent application Ser. No. 11/045,619, entitled "Combined MR-Ultrasound (US) Coil for Prostate-, Cevix-, and Rectum Cancer Imaging Diagnostics" filed on Jan. 27, 2005, which claims priority to U.S. Provisional Ser. No. 60/541,022 and U.S. patent application Ser. No. 11/044,239, entitled "Combined Intra-Rectal Optical-MR and Intra-Rectal Optical-US Device for Prostate-, Cevix-, Rectum Imaging Diagnostics" filed on Jan. 27, 2005, which claims priority to U.S. Provisional Ser. No. 60/541,020, which are both fully incorporated by reference herein.

BACKGROUND OF THE INVENTION

1. Field of the Invention

The present invention relates generally to the field of medical imaging, and, more particularly, to combined magnetic resonance-optical coil for prostate, cervix and rectum imaging.

2. Description of the Related Art

Various diagnostic imaging methods are currently used for the diagnosis of prostate, cervix and rectum cancers. Modern diagnostic imaging techniques include magnetic resonance ("MR"), computer tomography ("CT"), ultrasound ("US") and nuclear medicine (e.g., Positron Emission Tomography ("PET"), Single Photon Emission Computed Tomography ("SPECT")). A more accurate diagnosis can be provided by combining the different imaging techniques. In particular, anatomical information (e.g., bones and organs) from an anatomical imaging technique may be enriched with optical information from an optical imaging technique.

The different imaging techniques are typically combined during post-processing. Post-processing is generally time-consuming. Further, accurate combinations of anatomical and optical modalities are generally only possible with rigid structures, such as the brain. However, even the brain has minor movement, which can potentially render the combinations inaccurate.

SUMMARY OF THE INVENTION

In one aspect of the present invention, an apparatus for providing anatomical and molecular diagnostic imaging. The apparatus includes a magnetic resonance (MR) coil for inserting into a body cavity; and an optical component operatively integrated into the MR coil, the optical component for detecting fluorescence in the body cavity.

In another aspect of the present invention, a method is provided. A magnetic resonance (MR) coil with an integrated optical component is inserted into a body cavity. Combined data from the MR coil is received. The combined data includes MR-based data and fluorescence detection data.

In yet another aspect of the present invention, an apparatus for providing anatomical and molecular diagnostic imaging is provided. The apparatus includes a magnetic resonance (MR) coil for inserting into a body cavity, wherein the MR coil comprises a light-transparent balloon for fixing the MR coil in the body cavity; an illumination source operatively integrated into the MR coil, the illumination source for providing illumination light in the body cavity; and an optical head operatively integrated into the MR coil, the optical head for detecting fluorescence in the body cavity.

BRIEF DESCRIPTION OF THE DRAWINGS

The invention may be understood by reference to the following description taken in conjunction with the accompanying drawings, in which like reference numerals identify like elements, and in which.

DETAILED DESCRIPTION OF PREFERRED EMBODIMENTS

Figure 1:
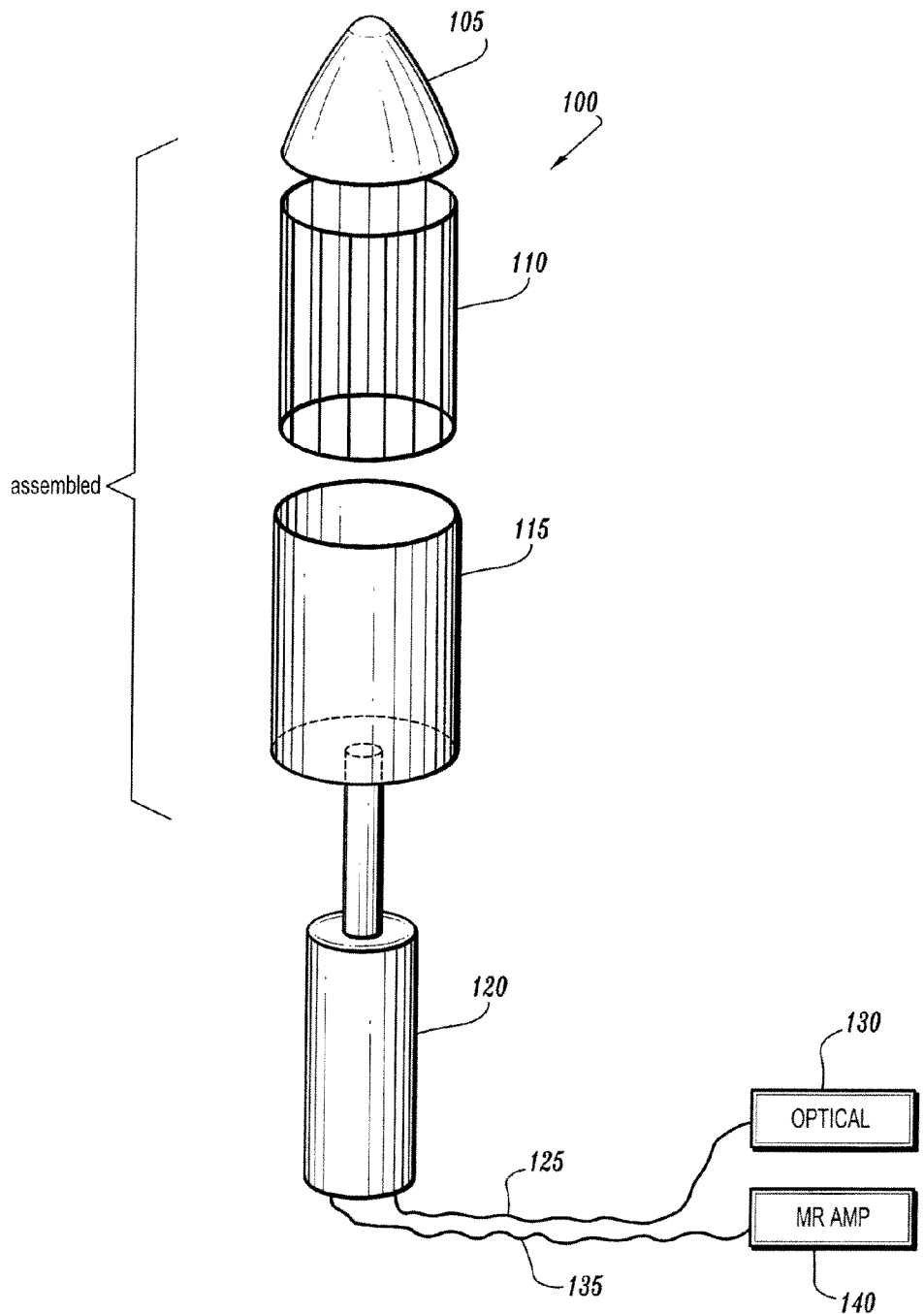
FIG. 1 depicts a combined MR-Optical device, in accordance with one exemplary embodiment of the present invention.

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. It is to be understood that the systems and methods described herein may be implemented in various forms of hardware, software, firmware, special purpose processors, or a combination thereof.

We present, in exemplary embodiments of the present invention, a system combining anatomical imaging technologies (e.g., MR) with optical imaging technologies. The system can be used for a variety of applications, including, but not limited to, (1) cancer diagnosis and staging; (2) image guidance; and (3) radiation therapy planning. Image guidance may include guiding a biopsy. For example, a prostatectomy potentially has severe side effects, such as impotence and incontinence. Thus, a histologically-confirmed diagnosis, such as one provided from a biopsy, may prevent unnecessary prostatectomy. Image guidance may also include guiding minimal invasive therapy. The present invention may be used to plan radiation therapy, for example, by detecting, and thus sparing, healthy tissue from radiation exposure.

We propose a combined magnetic resonance-optical ("MR-Optical") imaging device which is inserted into an accessible body cavity, such as the rectum or the vagina. An optical probe is integrated into a magnetic resonance ("MR") coil for enriching magnetic resonance-based images with optical-based information.

The combined MR-Optical device may be inserted into a body cavity and a combined image displaying anatomical imaging-based information and optical imaging-based information is received. The combined image may be used for any of a variety of practical applications, as contemplated by those skilled in the art, such as diagnostics (e.g., cancer diagnostics), application guiding and therapy planning.

Referring now to FIG. 1, an exploded view of a MR-Optical device 100 with combined MR imaging and optical imaging functionality is shown, in accordance with one exemplary embodiment of the present invention. The Optical-MR device 100 includes an optical probe 105, an MR coil 110, a sheath 115, and a handheld component 120. The optical probe 105 may be a trans-rectal optical transducer. The optical probe 105 may be pushed and/or pulled relative to the MR coil. The optical probe 105 may also rotate independently of the MR coil 110. The handheld component 120 allows a user to easily grip and handle the MR-Optical device 100. Optical compounds could be integrated into the coil. The optics facilitate the detection of fluorescence, preferably near infra red fluorescence. The measured fluorescence could be due to auto-fluorescence or an applied fluorescence probe (contract agent), which could be specific for the cancer type under investigation. The device could be used to detect activatable probes (smart probes).

The sheath 115 comprises a rigid housing, preferably trans-luminescent and filled with a coupling liquid (not shown). The coupling liquid preferably has the same optical index as the surrounding material to prevent bending of illumination light beams (described in greater detail below).

The MR-Optical device 100 includes an optical wire 125 operatively connected to an optical device 130. The MR-Optical device 100 further includes an MR wire 135 operatively connected to an amplifier 140. The optical wire could be lead through the center of MR coil 110 to the terminal detector/illuminator lead (optical probe 105). The optical wire 125 and the MR wire 135 may be parallel. The optical wire connects the head with an external light source and detector 130. It should be appreciated that, although not shown for the sake of simplicity, the amplifier 140 may be a component of a magnetic resonance tomography ("MRT") unit, as known to those skilled in the art. It should further be appreciated that although only one wire is shown, the Optical wire and the MR wire may include more than one wire, as contemplated by those skilled in the art. The MR coil 110 is preferably constructed to be translucent (e.g., the spacing between the wires may be made out of a translucent plastic, or the coil wires are constructed to be stable without a matrix/support).

In an alternate embodiment, the sheath 115 may be replaced with a light transparent balloon (not shown). The balloon may comprise a foldable investigation head with a liquid pump that fuels rotation. The sheath 115 and the balloon encompass the assembly of MR coil 110. The sheath 115 and the balloon may fix the MR-Optical device 100 to the body cavity. For example, when the MR-Optical device 100 is inserted in the body cavity, the balloon may be inflated. The balloon is preferably inflated with a coupling liquid, but, in an alternate embodiment, may be inflated with air. If a transparent balloon is used, the MR coil 110 (e.g., RF coil, bird cage) may be a flexible coil, such as the MRInnervu® commercially distributed by MEDRAD® Incorporated.

Furthermore, the sheath 115 and the balloon may be any of a variety of shapes (e.g. toric) as contemplated by those skilled in the art. The sheath 115 and the balloon are preferably shaped such that the MR-Optical device 110 can easily penetrate the particular body cavity being examined. Although only one balloon is described here, it should be appreciated that more than one (e.g., two) balloons may be used, as contemplated by those skilled in the art.

The optics can cover a 360 degree view or any limited angle. In the later case, the lead might be revolved from outside (independently of the MR coil). In both designs the optical lead can be push/pulled relatively to the MR coil. The balloon may not cover the optical lead. Illumination and light detection is not restricted by the balloon or by the coil. The balloon might be toric or two balloons might be used.

Illumination and fluorescent light could be guided by two separate wires. Alternative modulation techniques could be used to distinguish between illumination and fluorescent light. A particular design might operate in a CW (continues Wave) mode. Other designs might apply TD (time domain) measurements, OCT (optical tomography) or 2-Photone measurements. Tomographic methods might be applied to increase signal-to-noise or increase tissue penetration.

For the design of the optics, three general embodiments of the optics are possible. 1. Light wire (single fiber or fiber bundle) feeds a circular diffuser or discrete microscopic lenses assembled in a circle. The optical head is moved along the MR axis to get a good coverage of the cavity. 2. There is a rotating mirror at the end of the light wire, which projects the illumination light circularly on the cavity wall (e.g. rectum epithelia) and captures fluorescent light. The mirror is connected to a cardan shaft and motor that is located outside of the magnetic field. The optical head is moved along the MR axis to get a good coverage of the cavity. 3. There is a DMA (Digital Mirror Array), which projects the light in two or three dimension.

The following light sources are possible; broadband light source (e.e. xenonlamp or mercury lamp), LED or LED array, or a laser. The detector could be a CCD camera or a CMOS. All materials for the optics are nonconductive. If this is not feasible, conductive material has to be as small and thin as possible to keep HP coupling minimal.

The intra-rectal measurements obtained from the MR-Optical device 100 are preferably combined with an external phased array coils (not shown) for increasing signal-to-noise and increasing the area of the body cavity being examined. The external phased array coils are a typical component of a standard MRT unit. In one embodiment, the external phased array coils may be body arrays, providing ventral and dorsal receiver channels. The body arrays expand the viewable area in the body cavity, which provides information of lymph nodes for, for example, staging.

The MR-Optical device 100 may also be combined with monocrystalline iron oxide nanoparticles ("MION"), which is an MR contrast agent. The MION may be dually labeled with a fluorescence dye, which is an optical contrast agent. Further, the MR data set (i.e., the image obtained from the MRT unit using the present invention) may be used for segmentation and subsequence modeling of NIRF absorption and auto-florescence for increasing the NIRF image quality.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus for providing anatomical and molecular diagnostic imaging, comprising:
    a magnetic resonance (MR) coil assembly comprising MR coil wires and a translucent support between the MR coil wires for inserting into a body cavity; and an optical probe disposed within the MR coil assembly at a distal end of the apparatus adjacent the MR coil wires and moveable along an axis of the MR coil assembly relative to the MR coil, wherein the optical probe is configured to provide light to the body cavity and to detect fluorescence in the body cavity in response to the provided light, and wherein the optical probe is connected within the apparatus to enable the optical probe to be moved closer to a part of the MR coil in a first direction along the axis and moved further away from a part of the MR coil in a second and opposing direction along the same axis.

2. The apparatus of claim 1, wherein the optical probe detects near infra-red fluorescence.

3. The apparatus of claim 1, wherein the optical probe rotates independent of the MR coil.

4. The apparatus of claim 1, wherein movement of the optical probe is reproducible.

5. The apparatus of claim 1, further comprising a handheld component operatively connected to the MR coil.

6. The apparatus of claim 1, wherein the MR coil comprises a flexible coil.

7. The apparatus of claim 1, further comprising a sheath encompassing the MR coil.

8. The apparatus of claim 7, wherein the sheath comprises at least one light-transparent balloon for inflation after insertion into the body cavity to fix the MR coil in the body cavity.

9. The apparatus of claim 8, wherein the light-transparent balloon has a toric configuration.

10. The apparatus of claim 1, wherein the MR coil is operatively connected to a magnetic resonance amplifier.

11. The apparatus of claim 1, further comprising a first wire for receiving data from the MR coil and a second wire for receiving data from the optical probe.

12. The apparatus of claim 1, further comprising a modulation component for distinguishing between data from the MR coil and data from the optical probe.

13. The apparatus of claim 1, wherein the optical probe comprises a light wire for projecting the light and an optical head for detecting the fluorescence.

14. The apparatus of claim 13, wherein the light wire comprises at least one fiber, and wherein the at least one fiber feeds one of a circular diffuser and discrete microscopic lenses assembled in a circle.

15. The apparatus of claim 13, further comprising a rotating minor operatively connected to one end of the light wire, the rotating minor for circularly projecting the light in the body cavity.

16. The apparatus of claim 1, wherein the optical probe comprises a digital mirror array.

17. The apparatus of claim 1, further comprising a light source.

18. The apparatus of claim 17, wherein the light source comprises one of a broadband light source, a light-emitting diode (LED), and a laser.

19. The apparatus of claim 1, further comprising a phased array of MR coils for increasing signal-to-noise ratio and increasing the region of investigation.

20. The apparatus of claim 1, wherein the translucent support between the coil wires is plastic.

21. A method of collecting diagnosis data from a combined optical-magnetic resonance device, comprising:

inserting a magnetic resonance (MR) coil into a body cavity, wherein an optical probe is disposed within the MR coil and encompassed by a sheath filled with a coupling liquid;

providing light by the optical probe to the body cavity;

capturing fluorescence detection data by the optical probe in response to the provided light; and receiving combined data from the optical-magnetic resonance device, wherein the combined data comprises MR-based data from the MR coil and the fluorescence detection data from the optical probe, wherein the optical-magnetic resonance device comprises an MR coil assembly comprising the MR coil and a translucent support between coils of the MR coil, and the optical probe is moveable along an axis of the MR coil assembly.

22. The method of claim 21, further comprising:

applying a contrast agent in the body cavity.

23. The method of claim 21, wherein the step of inserting a magnetic resonance (MR) coil comprises inserting the magnetic resonance (MR) coil into one of a prostate, a cervix, and rectum.

24. The method of claim 21, further comprising analyzing the combined data for one of diagnostics, application guiding and therapy planning.

25. An apparatus for providing anatomical and molecular diagnostic imaging, comprising:

a magnetic resonance (MR) coil for inserting into a body cavity, wherein the MR coil comprises a light-transparent balloon for fixing the MR coil in the body cavity;

an illumination source disposed within the MR coil, the illumination source configured to provide illumination light in the body cavity; and an optical probe integrated into the MR coil, the optical probe configured to detect fluorescence in the body cavity;

wherein the optical probe is moveable along an axis of the MR coil assembly relative to the MR coil.

* * * * *